United States Patent
Wu et al.

(10) Patent No.: US 6,252,435 B1
(45) Date of Patent: Jun. 26, 2001

(54) COMPLEMENTARY DIFFERENTIAL AMPLIFIER WITH RESISTIVE LOADS FOR WIDE COMMON-MODE INPUT RANGE

(75) Inventors: Ke Wu; David Kwong, both of Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/679,683

(22) Filed: Oct. 5, 2000

(51) Int. Cl.$^7$ ........................................ H03K 5/22
(52) U.S. Cl. ............................... 327/65; 330/253
(58) Field of Search .................... 327/63, 65–67, 327/77, 89, 560–563; 330/253, 255, 258, 311

(56) References Cited

U.S. PATENT DOCUMENTS

| | | | |
|---|---|---|---|
| 4,037,170 | 7/1977 | Richards | 330/69 |
| 4,525,677 | 6/1985 | Rorden | 330/258 |
| 4,766,394 | * 8/1988 | Yukawa | 330/255 |
| 4,767,946 | 8/1988 | Taylor | 307/264 |
| 4,797,629 | 1/1989 | Widlar | 330/258 |
| 4,965,529 | 10/1990 | Laug | 330/255 |
| 5,291,149 | * 3/1994 | Nunoshima | 330/253 |
| 5,337,008 | * 8/1994 | Bodyal | 330/253 |
| 5,418,491 | 5/1995 | Bowers | 330/252 |
| 5,432,476 | 7/1995 | Tran | 330/255 |
| 5,436,594 | 7/1995 | Pace et al. | 330/258 |
| 5,491,448 | 2/1996 | Naokawa et al. | 330/264 |
| 5,668,468 | 9/1997 | Cargill | 323/316 |
| 5,760,648 | 6/1998 | Koifman et al. | 330/258 |
| 5,764,086 | * 6/1998 | Nagamatsu et al. | 327/65 |
| 5,859,558 | 1/1999 | Chen et al. | 327/355 |
| 5,933,040 | 8/1999 | Rokhsaz et al. | 327/306 |
| 5,963,053 | 10/1999 | Manobar et al. | 326/60 |

* cited by examiner

*Primary Examiner*—Toan Tran
(74) *Attorney, Agent, or Firm*—Stuart T. Auvinen (57) ABSTRACT

A differential amplifier has a wide common-mode input range since it uses two complementary amplifiers. One amplifier has a differential pair of n-channel transistors while the other amplifier has a differential pair of p-channel transistors. The input range is extended further by replacing the current mirror transistors with load resistors. The load resistors continue to supply current to the differential pair transistors even when the input is within a transistor-threshold of the power or ground rails. The current through the load resistors is mirrored to intermediate mirror transistors that have their gate connected to the resistor's terminal node. Current in the differential amplifiers is mirrored as if current-mirror transistors were present rather than the load transistors. The intermediate mirror transistors supply current to inverse-mirror transistors. Since the inverse mirror transistors are of the opposite type as the intermediate mirror transistors, the inverse mirror transistors continue to operate when the input voltage is in the extreme of the range that shuts off the intermediate mirror transistors. Outputs of the intermediate and inverse mirror transistors of the two amplifiers are connected together and buffered by a final stage.

20 Claims, 5 Drawing Sheets

COMPLEMENTARY DIFFERENTIAL AMPLIFIER WITH RESISTIVE LOADS FOR WIDE COMMON-MODE INPUT RANGE

FIELD OF THE INVENTION

This invention relates to CMOS comparators, and more particularly to CMOS wide-range differential amplifiers.

BACKGROUND OF THE INVENTION

Differential signals are often used for transmitting data. Fast (100 Mbps) Ethernet and asynchronous-transfer-mode (ATM) networks use differential signals to improve speed and noise immunity. The speed of these differential signals is increased when the transition is over a reduced voltage range, as output capacitances are charged and discharged over a smaller voltage range, requiring less current.

Often a signal with small voltage changes is applied to the differential input along with a constant bias voltage applied to both inputs. The common bias voltage is cancelled out, since it is applied to both of the differential inputs. However, this common bias voltage can vary at times.

Common-mode variations of the bias voltage affect both of the differential signals by the same amount so that data is not lost. Termination, power-supply variations, and voltage drops across transmission lines can alter common-mode input voltages. Using differential input signals cancels out these variations since both inputs are altered by the same amount. However, as the change in input voltages increases, some receivers are less responsive and may even fail. Thus, receivers often have a limited common-mode range.

A desirable feature of differential amplifiers is a wide common-mode input range. A wide input range allows the input voltage to move outside of a strict narrow voltage range. While complementary metal-oxide-semiconductor (CMOS) differential amplifiers have a relatively wide range, a problem is that the differential n-channel transistors can turn off as the common-mode input voltage is reduced to around 1 volt above ground. Thus standard CMOS differential amplifiers do not have as wide a common-mode range as desirable.

Opposite-Type Amplifier Compensates Common-Mode

A solution to the common-mode problem is to use two CMOS differential amplifiers that are logically inverses. One of the amplifiers uses n-channel differential transistors while the other uses p-channel differential transistors. See U.S. Pat. No. 5,963,053 by Manohar et al., and assigned to Pericom Semiconductor Corp. of San Jose, Calif.

The differential amplifier using the differential p-channel transistors does not turn off for low input voltages. The differential p-channel amplifier instead turns off for high input voltages. The second differential amplifier using differential p-channel transistors can be used in parallel with the differential n-channel amplifier. The differential p-channel amplifier operates for extremely low input voltages while the differential n-channel amplifier operates for high input voltages. Both amplifiers operate for mid-range input voltages, increasing performance and sensitivity for these intermediate input voltages.

Figure 1:
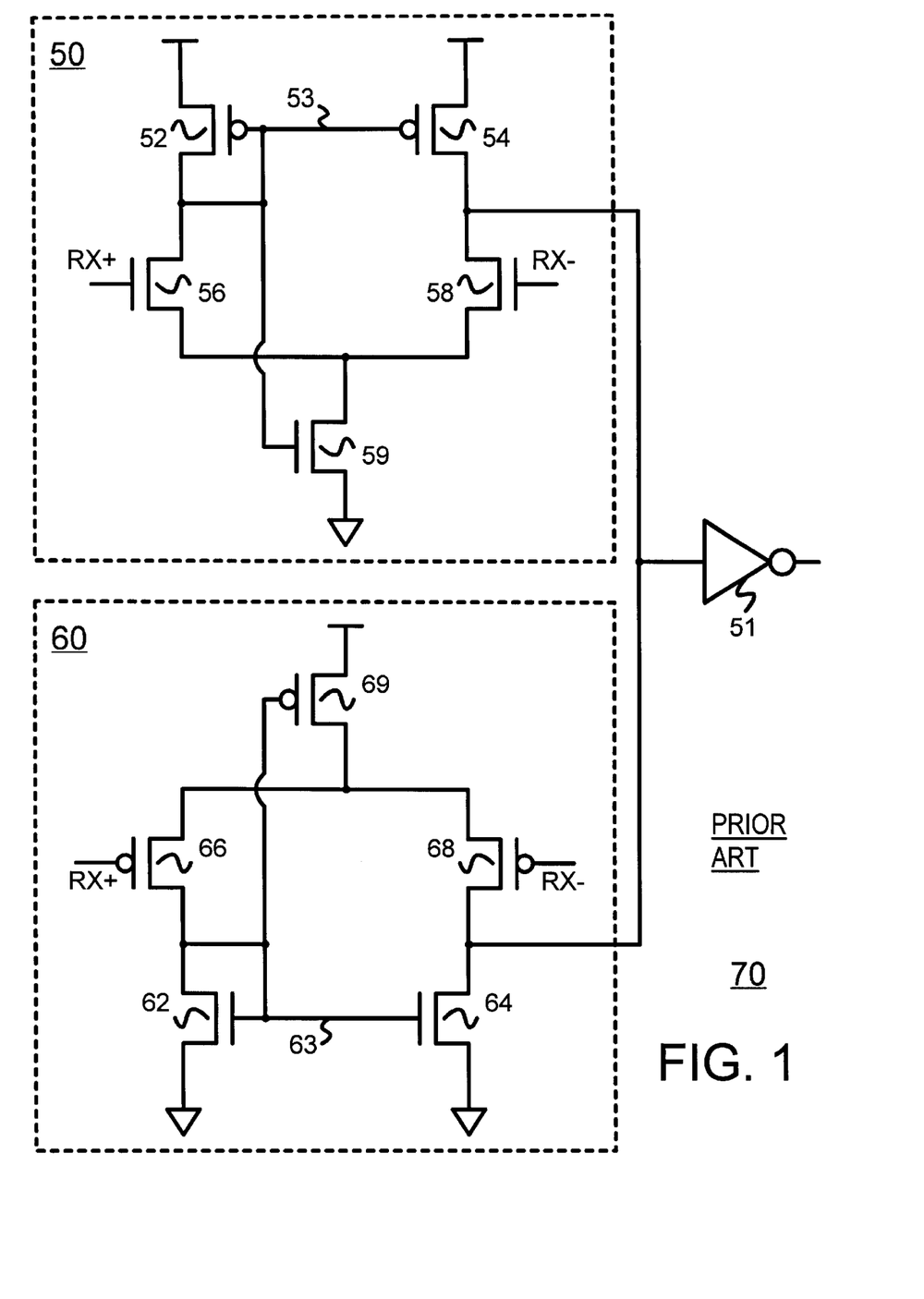
FIG. 1 is a schematic diagram of a prior-art complementary-amplifier receiver.

FIG. 1 is a schematic diagram of a prior-art complementary-amplifier receiver. N-type amplifier 50 uses n-channel differential transistors, while p-type amplifier 60 uses p-channel differential transistors. The RX+ and RX− inputs are coupled to the gates of n-channel differential transistors 56, 58 in n-type amplifier 50, and to the gates of p-channel differential transistors 66, 68 in p-type amplifier 60.

Current-mirror transistors 52, 54 are p-channel transistors in n-type amplifier 50, but current-mirror transistors 62, 64 are n-channel transistors in p-type amplifier 60. Node 53 is a bias voltage set by the drain of differential transistor 56. The bias voltage of node 53 controls the current through p-channel transistors 52, 54, and the tail current through n-channel tail transistor 59. This bias voltage depends on the input voltages applied to RX+ and RX−, and the sizes of all devices including transistors 52, 56, 59.

The gate-bias of node 63 in p-type amplifier 60 is set in a similar but inverted way. The bias voltage is set by the drain of differential p-channel transistor 66. The bias voltage of node 63 controls the current through n-channel current-mirror transistors 62, 64, and the head current through p-channel tail transistor 69. This bias voltage depends on the input voltages applied to RX+ and RX−, and the sizes of all the devices. Note that the bias voltage for p-type amplifier 60 is a different voltage than the bias for n-type amplifier 50. These bias voltages change relative to each other as the input voltages change.

For extremely low input voltages on RX+ and RX−, n-channel differential transistors 56, 58 can shut off, disabling n-type amplifier 50. However, these low voltages do not turn off p-channel differential transistors 66, 68. P-type amplifier 60 continues to amplify the difference in inputs RX+, RX−. Thus self-biased comparator 70 continues to operate for low input voltages, resulting in a wider common-mode input range.

While such a complementary differential amplifier is useful and has a wide common-mode range, a still wider range is desired. Power-supply voltages continue to be dramatically reduced as transistor device sizes are shrunk to prevent electrical breakdown that can occur with higher voltages of even 5 volts. Portable applications also demand low power-supply voltages. With the smaller power-supply voltages, the transistor threshold voltage becomes a larger and larger portion of the available power-to-ground voltage range. Thus amplifiers that are considered wide range for a 5-volt power supply are not sufficiently wide range for 2-volt power supplies.

What is desired is a complementary differential amplifier with a wide common-mode input range. Extending the input range relative to the power-supply is desired. A high-speed yet wide-range differential amplifier is desired that uses standard CMOS processing. While self-biasing is useful, an externally-biased differential amplifier is desired.

SUMMARY OF THE INVENTION

A wide input-range amplifier has a positive differential amplifier with a differential pair of transistors of a positive type of transistor that receive a differential input. A tail transistor of the positive type is coupled to receive current from both of the differential pair of transistors.

Load resistors are each coupled to receive current from a different one of the differential pair of transistors. Intermediate mirror transistors of a negative type each have a gate coupled to a node between a load resistor and one of the differential pair of transistors. Inverse mirror transistors of the positive type each are coupled to receive current from one of the intermediate mirror transistors. They have gates connected together and to a back node between one of the intermediate mirror transistors and one of the inverse mirror transistors.

An intermediate output is a front node between one of the intermediate mirror transistors and one of the inverse mirror transistors. The front node is not connected to the back node.

A negative differential amplifier has a differential pair of transistors of a negative type of transistor that also receive the differential input. A tail transistor of the negative type is coupled to receive current from both of the differential pair of transistors.

Load resistors are each coupled to receive current from a different one of the differential pair of transistors. Intermediate mirror transistors, of a positive type, each have a gate coupled to a node between a load resistor and one of the differential pair of transistors. Inverse mirror transistors, of the negative type, are each coupled to receive current from one of the intermediate mirror transistors. They have gates connected together and to a back node between one of the intermediate mirror transistors and one of the inverse mirror transistors.

An intermediate output is a front node between one of the intermediate mirror transistors and one of the inverse mirror transistors. The front node is not connected to the back node. Thus the positive and the negative differential amplifier both drive the intermediate output with the intermediate and inverse mirror transistors.

In further aspects of the invention a final stage receives the intermediate output. It drives a final output. The final stage has transistors with gates receiving the intermediate output. Thus the intermediate output is buffered by the final stage. The final stage includes a pullup transistor of the positive type and a pulldown transistor of the negative type. Drains of the pullup transistor and of the pulldown transistor are connected to drive the final output. Thus the final stage is a complementary push-pull driver.

In still further aspects the load resistors continue to conduct current when a voltage drop across the load resistors is less than a transistor-threshold voltage, while the transistors stop conducting current when a gate-to-source voltage is below the transistor-threshold voltage. Thus load current through the load resistors continues to flow to the differential pair of transistors when biased below the transistor-threshold voltage, whereby range is extended.

DETAILED DESCRIPTION

The present invention relates to an improvement in differential amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the common-mode input range of differential amplifiers can be increased by using two complementary amplifiers—one with p-channel, the other with n-channel differential input gates. The inventors have further realized that external biasing of the tail transistors can reduce variability compared with self-biasing. The inventors further realize that the current-mirror transistors can limit common-mode range. The current-mirror transistors can be replaced with resistors to further improve common-mode range.

Figure 2:
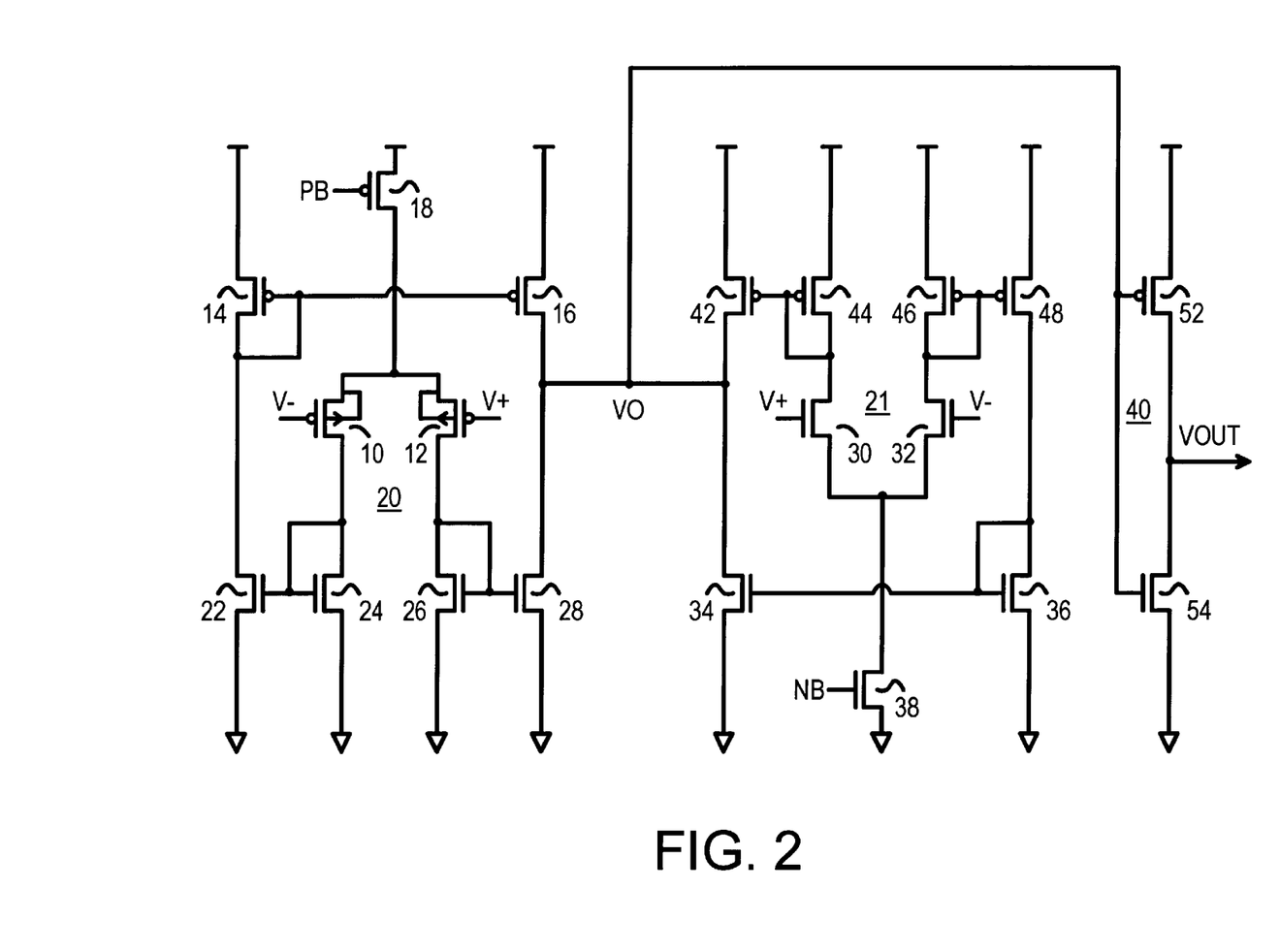
FIG. 2 is a diagram of a complementary amplifier with transistor loads.

Complementary Amplifier with Transistor Loads—FIG. 2

FIG. 2 is a diagram of a complementary amplifier with transistor loads. The amplifier uses two complementary metal-oxide-semiconductor (CMOS) amplifiers: n-channel amplifier 21 and p-channel amplifier 20. A differential input voltage, V+, V−, is applied to the gates of n-channel differential pair transistors 30, 32 of n-channel differential amplifier 21, and to the gates of p-channel differential pair transistors 10, 12 of p-channel differential amplifier 20. A fixed n-channel bias voltage NB is applied to the gate of n-channel tail transistor 38, and a p-channel bias voltage PB is applied to the gate of the 9-channel tail transistor 18. Tail transistors 18, 28 act as current sources in normal operation, supplying a tail current that is switched between the differential pair transistors in response to the differential input voltage.

P-channel current-mirror transistors 44, 46 supply current to n-channel differential pair transistors 30, 32. Each p-channel current mirror transistor 44, 46 has its gate connected to its drain, but instead of connecting the gates of transistors 44, 46 together, the gates are used to mirror current to intermediate stages. The gate of p-channel current mirror transistor 44 is connected to the gate of p-channel mirror transistor 42, which mirrors the current from transistor 44 to transistor 42. This mirrored current flows through n-channel intermediate mirror transistor 34. Likewise, The gate of p-channel current mirror transistor 46 is connected to the gate of p-channel mirror transistor 48, which mirrors the current from transistor 46 to transistor 48. This mirrored current flows through n-channel intermediate mirror transistor 36. Thus the difference in currents from transistors 44, 46 is mirrored down to n-channel intermediate mirror transistors 34, 36.

The gates of n-channel intermediate mirror transistors 34, 36 are connected together and to the drain of transistors 36, 48. The drains of transistors 34, 42 become the intermediate output VO.

The complementary p-channel amplifier 20 has similar but inverse current mirroring. Inner n-channel current-mirror transistors 24, 26 mirror their currents to n-channel mirror transistors 22, 28, which mirror the current difference to p-channel intermediate mirror transistors 14, 16. The drains of transistors 14, 22 are connected to the gates of p-channel mirror transistors 14, 16. The drains of transistors 16, 28 also drive intermediate output VO.

Intermediate output VO is buffered by final stage 40. VO is applied to the gates of p-channel transistor 52 and n-channel transistor 54. The drains of transistors 52, 54 drive the final output VOUT.

In operation, when differential input voltage V+ rises up above V−, more current is steered through n-channel differential pair transistor 30 than through transistor 32. The higher current pulls lower the gate and drain voltages of transistor 44, causing transistor 44 to drive more current with its larger gate-to-source voltage. The larger gate-to-source voltage is also applied to the gate of transistor 42, causing increased current flow through transistors 42, 34. The voltage of intermediate output VO also rises. The larger VO voltage is inverted by final stage 40, causing output voltage VOUT to fall.

The lower V− voltage on transistor 32 lowers current and causes the drain and gate of transistor 46 rise in voltage. The higher voltage is applied to the gate of p-channel transistor 48, reducing its current drive. The lower current through transistor 48 drops the gate and drain voltage of n-channel transistor 36. The lower gate voltage of n-channel transistors 34, 36 causes the intermediate output VO voltage to rise, reinforcing the action of transistor 42.

The p-channel differential amplifier operates in a similar but inverse fashion. When differential input voltage V+ rises and V− falls, p-channel differential pair transistor 10 has a larger gate-to-source voltage while transistor 12 has a smaller gate-to-source voltage. Thus more current is steered through transistor 10 and less through transistor 12. The increased current through transistor 10 raises its drain voltage, which is also the gate voltage of n-channel transistors 22, 24. The larger gate voltage increases current through transistors 22, 24. The larger current through transistor 22 pulls its drain voltage lower, which is also the gate voltage of p-channel transistors 14, 16. The lower gate voltage increases the gate-to-source voltage, increasing the current drive of p-channel transistors 14, 16. The larger current drive of p-channel transistor 16 raises its drain voltage, intermediate output VO. This lowers VOUT.

Likewise, the decreased current through p-channel differential pair transistor 12 lowers its drain voltage, lowering the gate voltage and current drives of n-channel transistors 26, 28. The lower current drive of n-channel transistor 28 causes its drain, VO, to rise in voltage, lowering VOUT. Thus p-channel differential amplifier 20 and n-channel differential amplifier 21 work in tandem to swing the output in the same direction.

Common-Mode Range Limited by Current Mirror

The common-mode range of the differential input is improved by using complementary amplifiers 20, 21. For example, when the common-mode input voltage bias of differential inputs V+, V− falls, the n-channel differential amplifier 21 eventually stops working as the differential voltages near the drain voltage of n-channel tail transistor 38. However, the lower input bias allows the p-channel differential amplifier 20 to continue operating normally. Thus p-channel differential amplifier 20 takes over from n-channel differential amplifier 21 as the common-mode input bias is lowered.

However, as the common-mode bias nears the ground rail, p-channel differential amplifier 20 also shuts down. The n-channel current-mirror transistors turn off as the input bias is lowered and their gate voltages approach the n-channel threshold voltage (Vtn) of about 0.7 volt. As the input voltages near this level, propagation delays increase sharply, drastically reducing performance of the amplifier.

The reverse happens as the common-mode input is raised. First, the p-channel differential amplifier 20 stops operating as the differential voltages near the drain voltage of p-channel tail transistor 18. However, the higher input bias allows the n-channel differential amplifier 21 to continue operating normally. N-channel differential amplifier 21 takes over from p-channel differential amplifier 21 as the common-mode input bias is raised.

However, as the common-mode bias nears the power-supply rail (Vcc), n-channel differential amplifier 21 also shuts down. The p-channel current-mirror transistors turn off as the input bias is raised and their gate voltages approach the power-supply voltage to within the p-channel threshold voltage. As the input voltages near this level, Vcc-|Vtp|, propagation delays increase sharply, drastically reducing performance of the amplifier.

Thus although complementary differential amplifiers extend the common mode range, the input range is still limited. The differential input voltages need to stay within a range of roughly Vtn to Vcc-|Vtp|. For a 5-volt Vcc, the input range is limited to about 0.7 to 4.3 volts. However, for reduced power supplies, the range is tighter. For example, a 3-volt Vcc has a range of only 1.6 volts (0.7 to 2.3 volts), while a 1.8-volt power supply allows an input range of only 0.4 volt (0.7 to 1.1 volt). Thus shrinking power supplies severely limit the input range.

Figure 3:
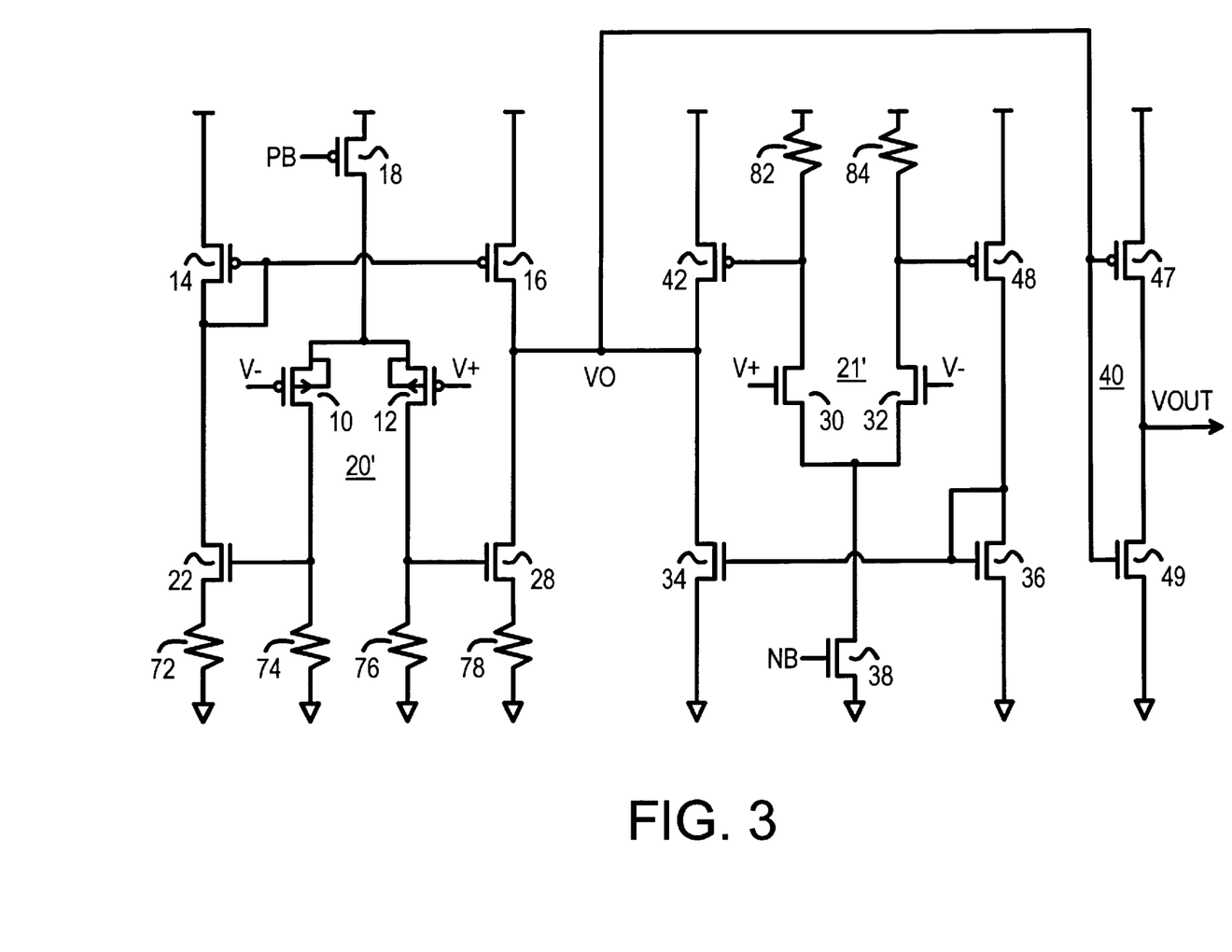
FIG. 3 is a schematic of the complementary amplifier using resistor loads for the current mirrors.

Current-Mirror Replaced with Resistor Loads—FIG. 3

FIG. 3 is a schematic of the complementary amplifier using resistor loads for the current mirrors. Two complementary differential amplifiers are used: p-channel differential amplifier 20 and n-channel differential amplifier 21. The differential input voltage V+, V− is applied to the gates of p-channel differential pair transistors 10, 12 and n-channel differential pair transistors 30, 32. Tail transistors 18, 38 are biased by bias voltages PB, NB to generate tail currents that are switched among the differential pair transistors in response to changes in the differential input voltages.

However, the p-channel current-mirror loads of n-channel differential amplifier 21 are replaced by load resistors 82, 84. Load resistor 82 sources current to the drain of n-channel differential transistor 30, while load resistor 84 sources current to the drain of n-channel differential transistor 32. The current sourced by each of load resistors 82, 84 depends on the drain voltage using Ohm's law, I=V/R, where V is Vcc-Vdrain.

As the common-mode input voltage is raised toward Vcc, load resistors 82, 84 continue to source current. They do not turn off when the drain voltages near Vcc-|Vtp| as was true in FIG. 2. Instead, then continue to source current as the drain voltage rises all the way up to Vcc. There is no intrinsic turn-off of the source (load) current at Vcc-|Vtp| as occurs for a p-channel transistor load.

Using load resistor 82, 84 allows n-channel differential amplifier 21 to continue to operate almost all the way up to Vcc. The common-mode input range is extended to almost Vcc, rather than dropping off 0.7 volt earlier at Vcc-|Vtp|.

The n-channel current-mirror transistors in p-channel differential amplifier 20 are likewise replaced with load resistors 74, 76. Load resistor 74 sinks current from the drain of p-channel differential transistor 10, while load resistor 76 sinks current from the drain of p-channel differential transistor 12. The current sinked by load resistors 74, 76 is a linear function of the drain voltage (I=Vdrain/R). Current continues to flow through load resistors 74, 76 even when their drain voltage falls below the n-channel threshold, Vtn, of about 0.7 volt. Thus p-channel differential amplifier 20 can continue to operate even when the common-mode input voltage drops below 0.7 volt.

Even though the current-mirror transistors are replaced with load resistors, the intermediate stages still mirror the current through the load resistors. The gate of p-channel intermediate mirror transistor 42 is connected to the drain of n-channel differential pair transistor 30, while the gate of p-channel intermediate mirror transistor 48 is connected to the drain of n-channel differential pair transistor 32. The currents through intermediate mirror transistors 42, 48 thus depend on the drain voltages. differential-to-single-ended conversion is provided by n-channel mirror transistors 34, 36.

Likewise for p-channel differential amplifier 20, the gates of n-channel intermediate mirror transistors 22, 28 are coupled to the drain of p-channel differential pair transistors 10, 12. The currents through intermediate mirror transistors 22, 28 thus depend on the drain voltages. Differential-to-single-ended conversion is provided by p-channel mirror transistors 14, 16. Intermediate output VO is driven by transistors 16, 28 and 34, 42. Final stage 40 uses transistors 47, 49 to buffer VO to VOUT.

Additional load resistors 72, 78 can optionally be added to the sources of n-channel intermediate mirror transistors 22, 28.

Operation—FIG. 3

In operation, when differential input voltage V+ rises up above V−, more current is steered through n-channel differential pair transistor 30 than through transistor 32. The higher current pulls lower drain voltages of transistor 32, which is also the gate voltage of intermediate mirror transistor 42. The lower gate voltage produces a higher gate-to-source voltage, increasing the current drive of transistor 42. Increased current flows through transistors 42, 34. The voltage of intermediate output VO also rises. The larger VO voltage is inverted by final stage 40, causing output voltage VOUT to fall.

The lower V− voltage on transistor 32 lowers its current and causes its drain voltage to rise. The higher voltage is also applied to the gate of p-channel transistor 48, reducing its current drive. The lower current through transistor 48 drops the gate and drain voltage of n-channel transistor 36. The lower gate voltage of n-channel transistors 34, 36 causes the intermediate output VO voltage to rise, reinforcing the action of transistor 42.

The p-channel differential amplifier operates in a similar but inverse fashion. When differential input voltage V+ rises and V− falls, p-channel differential pair transistor 10 has a larger gate-to-source voltage while transistor 12 has a smaller gate-to-source voltage. Thus more current is steered through transistor 10 and less through transistor 12. The increased current through transistor 10 raises its drain voltage, which is also the gate voltage of n-channel intermediate mirror transistor 22. The larger gate voltage increases current through transistor 22. The larger current through transistor 22 pulls its drain voltage lower, which is also the gate voltage of p-channel transistors 14, 16. The lower gate voltage increases the gate-to-source voltage, increasing the current drive of p-channel transistors 14, 16. The larger current drive of p-channel transistor 16 raises its drain voltage, intermediate output VO. This lowers VOUT.

Likewise, the decreased current through p-channel differential pair transistor 12 lowers its drain voltage, lowering the gate voltage and current drive of n-channel transistor 28. The lower current drive of n-channel transistor 28 causes its drain, VO, to rise in voltage, lowering VOUT. Thus p-channel differential amplifier 20 and n-channel differential amplifier 21 work in tandem to swing the output in the same direction.

A current-mirroring action occurs as if the current-mirror transistors were present, even though they are replaced by load resistors 82, 84, 74, 76. The load resistors act as virtual current-mirror transistors, except that they do not turn off when the threshold voltage is reached. P-channel intermediate mirror transistors 42, 48 can turn off when their gate voltages rise above Vcc-|Vtp|.

Although intermediate mirror transistors can turn off, they don't have the same delay sensitivity problem as the common mode bias changes. The immediate current mirror transistors turn off when their respective gate voltages fall or rise beyond their thresholds for either approach. However, the current drive of the immediate current mirror is more linear to common mode bias changes for the resistor load driver due to the fact that the gate voltages are generated from linear resistors instead of diode-connected MOSFET's. Simulation shows that the drive current variation (max current —min current ) vs. common mode bias from Vo is reduced by at least half. As a result, the overall propagation delay is almost constant over the wide common mode range.

Since the intermediate-stage current mirroring is provided by n-channel transistors 34, 38, as the common-mode input voltage rises, these n-channel transistors 34, 38 continue to operate normally since they are n-channel transistors. Thus the current mirror in the intermediate stages continues to operate, since they are complements of the initial stage's current mirror (p-channel transistors for differential amplifier 21.)

Values of load resistors 82, 84 can be on the order of 10 K-ohm, while for load resistors 74, 76 resistances of 8.8 K-ohm can be used. Of course, many other values of resistance can be substituted for optimal use in different processes. Resistors 72, 78 can be removed in another embodiment. In another embodiment, additional resistors can be added in series to resistors 72, 78 and transistors 42, 48.

The well bias of p-channel differential pair transistors 10, 12 can be connected to their sources, rather than to Vcc. This reduces the body effect on these transistors. When a dual-well semiconductor-on-insulator (SOI) process is used, n-channel differential pair transistors 30, 32 could also have their body terminals connected to their drains rather than to ground.

Figure 4:
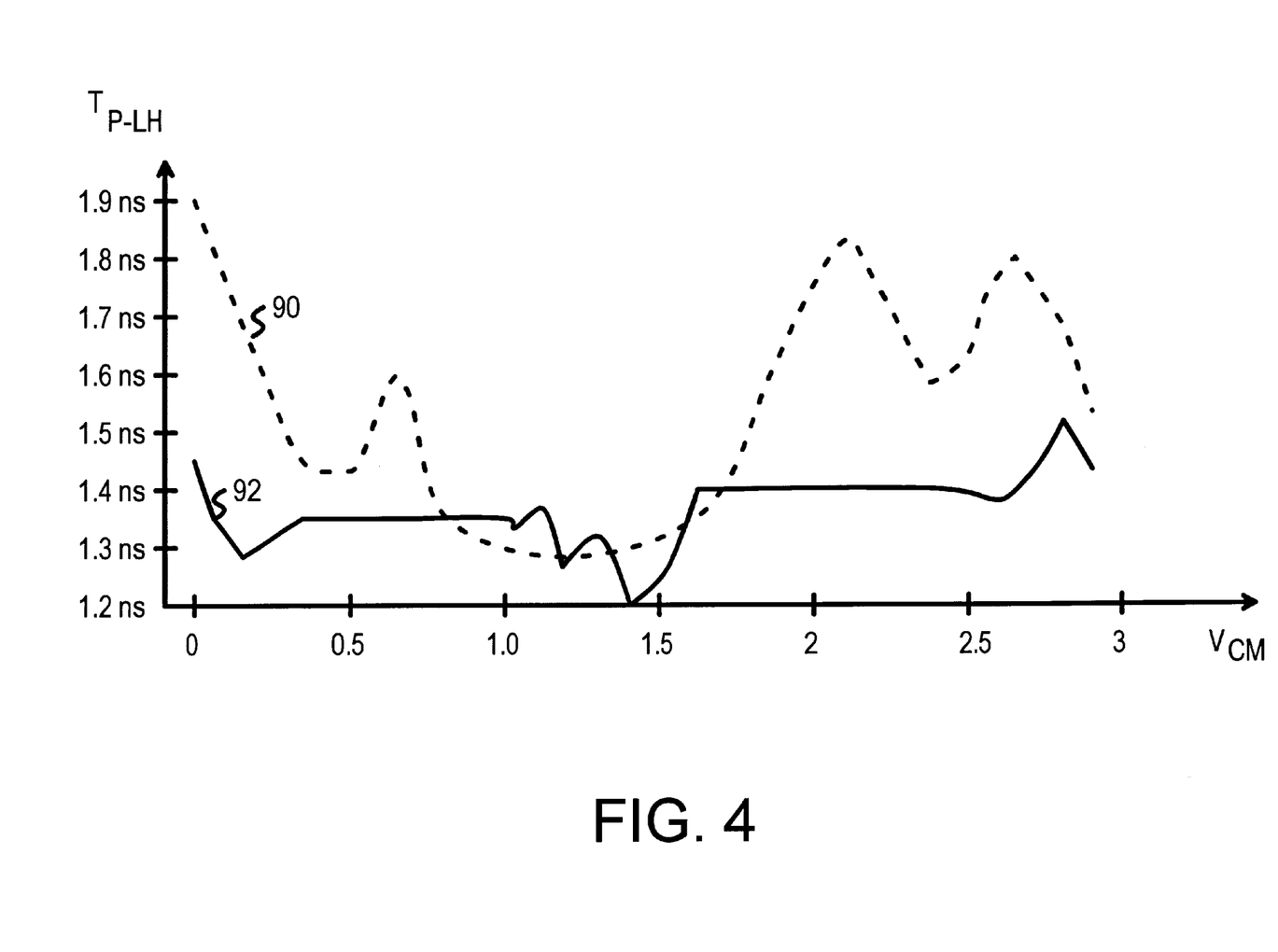
FIG. 4 shows waveforms comparing the low-to-high propagation delay of the amplifiers of FIGS. 2 and 3.
Figure 5:
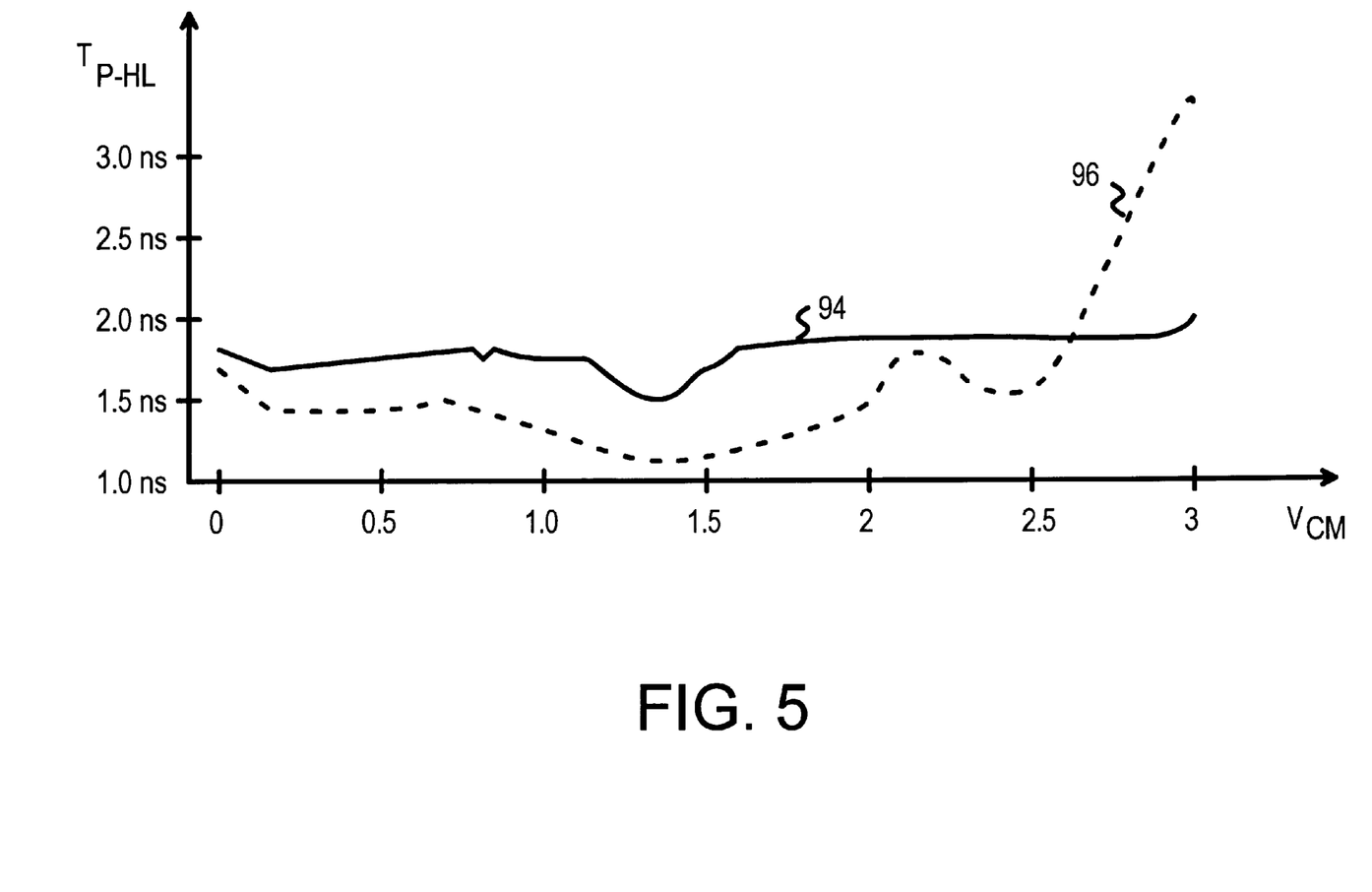
FIG. 5 shows waveforms comparing the high-to-low propagation delay of the amplifiers of FIGS. 2 and 3.

Waveforms—FIGS. 4,5

FIG. 4 shows waveforms comparing the low-to-high propagation delay of the amplifiers of FIGS. 2, 3 over a range of common-mode input biases. Circuit simulations of the differential amplifier of FIG. 2 using transistor current-mirror loads were performed to generate curve 90, while simulations of the differential amplifier of FIG. 3 using resistor loads were performed to generate curve 92. The power-supply voltage was set to 3 volts in the simulations, and the common-mode input bias Vcm was swept from 0 to Vcc (3 volts). Input signals of positive 350 milli-volt and negative 350 milli-volt are applied to the differential inputs. The x-axis shows the common mode bias Vcm, while the y-axis shows the low-to-high propagation delay of the VOUT output.

As can be seen from curve 90, the transistor-load amplifier has high delays when the common-mode input is below 0.7 volt. This is due to the shutting off of the n-channel mirror transistors. Delays are also high above 1.7 volt due to the shutting off of the p-channel mirror transistors. The delay increases since the effective drive from the differential pairs decrease when the common-mode biases deviate from the most optimum point. Although delays fall from 2.0 to 2.3 volts, delays again increase above 2.3 volts as the p-channel mirror transistors turn off above Vcc-|Vtp|.

In contrast, curve 92 shows that the differential amplifier of FIG. 3 with the resistor loads has low propagation delays for a wider range of input voltages. Delays increase only when the common-mode input bias Vcm is below 0.3 volt and above 2.6 volt. Thus the amplifier continues to operate for another 0.3–0.4 volt below 0.7 volt and above 2.3 volt (Vcc-|Vtp|). The common-mode range is extended by about 0.7 volt.

FIG. 5 shows waveforms comparing the high-to-low propagation delay of the amplifiers of FIGS. 2, 3 over a range of common-mode input biases. Circuit simulations of the differential amplifier of FIG. 2 using transistor current-mirror loads were performed to generate curve 96, while simulations of the differential amplifier of FIG. 3 using resistor loads were performed to generate curve 94. The power-supply voltage was set to 3 volts in the simulations, and the common-mode input bias Vcm was swept from 0 to Vcc (3 volts). The x-axis shows the common mode bias Vcm, while the y-axis shows the high-to-low propagation delay of the VOUT output.

Curve 96 rises sharply above 2.5 volt, as the p-channel mirror transistors turn off when the gate and drains rise above Vcc-|Vtp|. Propagation delays also rise when the common-mode input bias is below about 0.7 as the n-channel mirror transistors turn off. In contrast, curve 94 is essentially flat for a wide range of common-mode biases, turning up only near the power and ground rails.

Advantages of the Invention

A complementary differential amplifier has a wide common-mode input range. The input range is extended relative to the power-supply, and is especially useful for lower power supplies that are more common as device sizes shrink. A high-speed yet wide-range differential amplifier is obtained that uses standard CMOS processing. Instead of self-biasing, an externally-biased differential amplifier is used for better control at extreme input biases. An extra 0.3 to 0.4 volts of input range at each end is obtained using the resistor loads. The overall input range is extended by at least 0.7 volts when the transistor current mirrors are replaced with resistor loads.

Of course, the advantages and benefits described may not apply to all embodiments of the invention.

Alternate Embodiments

Several other embodiments are contemplated by the inventors. For example additional devices can be added, and additional stages can be used. A different type of final stage may be substituted. Newer process technologies and devices can be used. Many different transistor and resistor sizes can be employed.

Actual currents through the load resistors can be somewhat non-linear due to a variety of physical effects, such as current crowding around corners of the resistor, or domain boundary resistance when poly-silicon resistors are used. However, the resistance can be approximated using the linear Ohm's law, and the resistors should continue to supply current near the power and ground rails. The transistor threshold voltages can vary from 0.7 volt, depending on the process used. Lower-threshold transistors with 0.5-volt thresholds are possible. The exact threshold point is not exact, since sub-threshold conduction can occur near the transistor threshold.

The abstract of the disclosure is provided to comply with the rules requiring an abstract which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b).

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A wide input-range amplifier comprising:
   a positive differential amplifier having:
   a differential pair of transistors of a positive type of transistor, receiving a differential input;
   a tail transistor of the positive type, coupled to receive current from both of the differential pair of transistors;
   load resistors, each coupled to receive current from a different one of the differential pair of transistors;
   intermediate mirror transistors, of a negative type, each having a gate coupled to a node between a load resistor and one of the differential pair of transistors;
   inverse mirror transistors, of the positive type, each coupled to receive current from one of the intermediate mirror transistors, having gates connected together and to a back node between one of the intermediate mirror transistors and one of the inverse mirror transistors;
   an intermediate output, being a front node between one of the intermediate mirror transistors and one of the inverse mirror transistors, the front node not being connected to the back node;
   a negative differential amplifier having:
   a differential pair of transistors of a negative type of transistor, receiving the differential input;
   a tail transistor of the negative type, coupled to receive current from both of the differential pair of transistors;
   load resistors, each coupled to receive current from a different one of the differential pair of transistors;
   intermediate mirror transistors, of a positive type, each having a gate coupled to a node between a load resistor and one of the differential pair of transistors;
   inverse mirror transistors, of the negative type, each coupled to receive current from one of the intermediate mirror transistors, having gates connected together and to a back node between one of the intermediate mirror transistors and one of the inverse mirror transistors; and
   an intermediate output, being a front node between one of the intermediate mirror transistors and one of the inverse mirror transistors, the front node not being connected to the back node;
   whereby the positive and the negative differential amplifier both drive the intermediate output with the intermediate and inverse mirror transistors.

2. The wide input-range amplifier of claim 1 further comprising:
   a final stage, receiving the intermediate output, for driving a final output, the final stage having transistors with gates receiving the intermediate output,
   whereby the intermediate output is buffered by the final stage.

3. The wide input-range amplifier of claim 2 wherein the final stage includes a pullup transistor of the positive type and a pulldown transistor of the negative type, wherein drains of the pullup transistor and of the pulldown transistor are connected to drive the final output,
   whereby the final stage is a complementary push-pull driver.

4. The wide input-range amplifier of claim 2 wherein the transistors of the positive type are p-channel metal-oxide-semiconductor (MOS) transistors and the transistors of the negative type are n-channel metal-oxide-semiconductor (MOS) transistors.

5. The wide input-range amplifier of claim 4 wherein the load resistors continue to conduct current when a voltage drop across the load resistors is less than a transistor-threshold voltage, while the transistors stop conducting current when a gate-to-source voltage is below the transistor-threshold voltage, whereby load current through the load resistors continues to flow to the differential pair of transistors when biased below the transistor-threshold voltage, whereby range is extended.

6. The wide input-range amplifier of claim 5 wherein the load resistors in the negative differential amplifier are connected at one terminal to a power supply and connected to a drain of one of the differential pair of transistors at another terminal of a load resistor, each load resistor sourcing current to a different one of the differential pair of transistors of the negative type;

wherein the load resistors in the positive differential amplifier are connected at one terminal to a ground and connected to a drain of one of the differential pair of transistors at another terminal of a load resistor, each load resistor sinking current from a different one of the differential pair of transistors of the positive type, whereby the load resistors are connected to power and ground.

7. The wide input-range amplifier of claim 6 wherein the tail transistor in the negative differential amplifier has a source connected to the ground and a gate connected to a first fixed bias voltage;

wherein the tail transistor in the positive differential amplifier has a source connected to the power supply and a gate connected to a second fixed bias voltage, whereby tail transistors have fixed gate biases.

8. The wide input-range amplifier of claim 7 wherein the inverse mirror transistors in the positive differential amplifier have sources connected to the power supply;

wherein the inverse mirror transistors in the negative differential amplifier have sources connected to the ground.

9. The wide input-range amplifier of claim 8 wherein the intermediate mirror transistors in the positive differential amplifier have sources connected to ground through source resistors, whereby the source resistors connect the intermediate mirror transistors to ground in the positive differential amplifier.

10. The wide input-range amplifier of claim 9 wherein the differential pair of transistors in the positive differential amplifier are formed in a well having a substrate terminal connected to sources of the differential pair of transistors, whereby substrate-to-source bias is zero for the differential pair of transistors in the positive differential amplifier.

11. The wide input-range amplifier of claim 10 wherein the differential input has a positive input and a negative input, the positive input being applied to one gate of each differential pair of transistors, while the negative input is applied to another of each differential pair of transistors;

wherein the differential input includes a small-signal component being a difference in voltage between the positive input and the negative input, and a common-mode bias being a same bias voltage applied to both the positive input and the negative input;

wherein the wide input-range amplifier amplifies the small signal component to generate the intermediate output, but substantially rejects changes in the same bias voltage, whereby the small signal component is amplified while changes in the common-mode bias are substantially rejected over a wide range of the common-mode bias.

12. The wide input-range amplifier of claim 11 wherein the wide range of the common-mode bias includes voltages from below a transistor-threshold voltage of the negative type of transistors to greater than a power-supply voltage less an absolute value of a transistor-threshold voltage of the positive type of transistors, whereby input range extends beyond transistor-threshold limits.

13. A complementary differential amplifier comprising:
a positive differential amplifier having:
a first p-channel differential transistor, having a gate receiving a first differential input, for conducting current from a p-tail node to a first p-branch node;
a first p-load resistor, coupled between the first p-branch node and a ground, for sinking current even when a voltage difference from the first p-branch node to the ground is less than a transistor threshold voltage;
a second p-channel differential transistor, having a gate receiving a second differential input, for conducting current from the p-tail node to a second p-branch node;
a second p-load resistor, coupled between the second p-branch node and a ground, for sinking current even when a voltage difference from the second p-branch node to the ground is less than a transistor threshold voltage;
a p-channel tail transistor for conducting current from a power supply to the p-tail node, the current being steered among the first and second p-channel differential transistors in response to a difference in voltage between the first and second differential inputs;
a first n-channel intermediate mirror transistor, having a gate coupled to the first p-branch node, for sinking current from an intermediate output node;
a first p-channel inverse mirror transistor, having a gate connected to a p-back node, for sourcing current to the intermediate output node;
a second n-channel intermediate mirror transistor, having a gate coupled to the second p-branch node, for sinking current from the p-back node;
a second p-channel inverse mirror transistor, having a gate connected to the p-back node, for sourcing current to the p-back node;
a negative differential amplifier having:
a first n-channel differential transistor, having a gate receiving the first differential input, for conducting current from an n-tail node to a first n-branch node;
a first n-load resistor, coupled between the first n-branch node and the power supply, for sourcing current even when a voltage difference from the power supply to the first n-branch node is within the transistor threshold voltage;
a second n-channel differential transistor, having a gate receiving the second differential input, for conducting current from the n-tail node to a second n-branch node;
a second n-load resistor, coupled between the second n-branch node and the power supply, for sourcing current even when a voltage difference from the power supply to the second n-branch node is within the transistor threshold voltage;
a n-channel tail transistor for conducting current from the n-tail node to the ground, the current being steered among the first and second n-channel differential transistors in response to the difference in voltage between the first and second differential inputs;
a first p-channel intermediate mirror transistor, having a gate coupled to the first n-branch node, for sourcing current to the intermediate output node;

a first n-channel inverse mirror transistor, having a gate connected to an n-back node, for sinking current from the intermediate output node;

a second p-channel intermediate mirror transistor, having a gate coupled to the second n-branch node, for sourcing current to the n-back node; and a second n-channel inverse mirror transistor, having a gate connected to the n-back node, for sinking current from the n-back node;

whereby the intermediate output node is driven by both the positive and negative differential amplifiers that use load resistors connected to differential transistors.

14. The complementary differential amplifier of claim 13 wherein the p-channel tail transistor has a gate coupled to a first bias voltage; and wherein the n-channel tail transistor has a gate coupled to a second bias voltage, whereby tail transistors are biased by bias voltages.

15. The complementary differential amplifier of claim 14 wherein the first and second n-channel inverse mirror transistors have sources connected to the ground;

wherein the first and second p-channel inverse mirror transistors have sources connected to the power supply;

wherein the first and second n-channel intermediate mirror transistors have sources connected to the ground;

wherein the first and second p-channel intermediate mirror transistors have sources connected to the power supply, whereby mirror transistors are connected to power and ground rails.

16. The complementary differential amplifier of claim 14 further comprising:

a first source resistor, coupled between a source of the first n-channel intermediate mirror transistor and the ground;

a second source resistor, coupled between a source of the second n-channel intermediate mirror transistor and the ground, whereby source resistors are used in the positive differential amplifier.

17. The complementary differential amplifier of claim 16 further comprising:

a final stage, having:

a pullup p-channel transistor with a gate receiving the intermediate output node and a drain driving a final output and a source connected to the power supply;

a pulldown n-channel transistor with a gate receiving the intermediate output node and a drain driving the final output and a source connected to the ground;

whereby the intermediate output node is buffered by the final stage.

18. An extended input-bias range amplifier comprising:

upper-ranging amplifier means for amplifying a small-signal difference between a first and a second differential input, the upper-ranging amplifier means operable in an upper range approaching a power-supply voltage, the upper-ranging amplifier means comprising:

first differential transistors means, responsive to the first differential input, for conducting current from a first load node to a first tail node;

first resistor means, coupled to the power-supply voltage, for conducting current to the first load node;

second differential transistors means, responsive to the second differential input, for conducting current from a second load node to the first tail node;

second resistor means, coupled to the power-supply voltage, for conducting current to the second load node;

first tail means, coupled to the first tail node, for conducting current from the first tail node to a ground;

first intermediate mirror means for conducting current to an intermediate output node in response to a voltage of the first load node;

second intermediate mirror means for conducting current to a first back node in response to a voltage of the second load node;

first inverse mirror means, for conducting current from the intermediate output node in response to a voltage of the first back node;

lower-ranging amplifier means for amplifying the small-signal difference between the first and second differential input, the lower-ranging amplifier means operable in a lower range approaching a ground voltage, the lower-ranging amplifier means comprising:

third differential transistors means, responsive to the first differential input, for conducting current from a second tail node to a third load node;

third resistor means, coupled to the ground voltage, for conducting current from the third load node;

fourth differential transistors means, responsive to the second differential input, for conducting current from the second tail node to a fourth load node;

fourth resistor means, coupled to the ground voltage, for conducting current from the fourth load node;

second tail means, coupled to the second tail node, for conducting current from the power-supply voltage to the second tail node;

third intermediate mirror means for conducting current from the intermediate output node in response to a voltage of the third load node;

fourth intermediate mirror means for conducting current from a second back node in response to a voltage of the fourth load node; and second inverse mirror means, for conducting current to the intermediate output node in response to a voltage of the second back node;

whereby the upper-ranging and lower-ranging amplifier means drives the intermediate output node.

19. The extended input-bias range amplifier of claim 18 wherein the first inverse mirror means comprises a pair of n-channel transistors with gates connected to the first back node, while the second inverse mirror means comprises a pair of p-channel transistors with gates connected to the second back node, wherein the first and second differential transistor means, the first tail means, and the third and fourth intermediate mirror means each comprise n-channel transistors;

wherein the third and fourth differential transistor means, the second tail means, and the first and second intermediate mirror means each comprise p-channel transistors.

20. The extended input-bias range amplifier of claim 18 wherein the first, second, third, and fourth resistor means conduct a current that is approximated by Ohm's law and wherein an input range of a common bias to the first and second differential inputs extends from 0.3 volt to 0.4 volt below a power-supply voltage.

* * * * *